United States Patent
Kim et al.

(10) Patent No.: US 11,551,740 B2
(45) Date of Patent: Jan. 10, 2023

(54) SEMICONDUCTOR MEMORY DEVICE AND REFRESH OPERATION METHOD, INCLUDING INPUT CIRCUIT, PLURALITY OF LATCHES, PLURALITY OF COUNTERS AND REFRESH CONTROLLER FOR GENERATING RESET SIGNALS

(71) Applicant: SK hynix Inc., Gyeonggi-do (KR)

(72) Inventors: Woongrae Kim, Gyeonggi-do (KR); Kwi Dong Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/353,004

(22) Filed: Jun. 21, 2021

(65) Prior Publication Data
US 2022/0230670 A1    Jul. 21, 2022

(30) Foreign Application Priority Data
Jan. 15, 2021    (KR) .................. 10-2021-0006102

(51) Int. Cl.
*G11C 11/406*    (2006.01)
(52) U.S. Cl.
CPC .................. *G11C 11/406* (2013.01)
(58) Field of Classification Search
CPC .................. G11C 11/406; G11C 11/40607
USPC .................................. 365/149, 222
See application file for complete search history.

(56) References Cited

U.S. PATENT DOCUMENTS

| 2011/0292710 A1* | 12/2011 | Matsubayashi | G11C 11/406 365/94 |
| 2018/0025769 A1* | 1/2018 | Lee | G11C 11/4093 365/189.05 |
| 2019/0122722 A1 | 4/2019 | Kamada et al. | |
| 2019/0287609 A1* | 9/2019 | Kim | G11C 11/4093 |

FOREIGN PATENT DOCUMENTS

KR    10-2015-0099170    8/2015

* cited by examiner

*Primary Examiner* — Connie C Yoha
(74) *Attorney, Agent, or Firm* — IP & T Group LLP

(57) ABSTRACT

A semiconductor memory device includes: an input control circuit suitable for providing an active address which is input together with an active command, as an input address; a plurality of latches suitable for sequentially storing, as a latch address, the input address according to input control signals and outputting the latch addresses as a target address according to output control signals; a plurality of counters respectively corresponding to the latches and each suitable for increasing, when the active address matches the latch address stored in the latch, a counting value corresponding to the latch; and a refresh controller suitable for dividing the counters and the latches into a plurality of groups based on the counting values and generating, in response to a refresh command, reset signals for initializing the counters included in one group of the groups.

27 Claims, 12 Drawing Sheets

SEMICONDUCTOR MEMORY DEVICE AND REFRESH OPERATION METHOD, INCLUDING INPUT CIRCUIT, PLURALITY OF LATCHES, PLURALITY OF COUNTERS AND REFRESH CONTROLLER FOR GENERATING RESET SIGNALS

CROSS-REFERENCE TO RELATED APPLICATIONS

The present application claims priority of Korean Patent Application No. 10-2021-0006102, filed on Jan. 15, 2021, which is incorporated herein by reference in its entirety.

BACKGROUND

1. Field

Embodiments of the present invention relate to a semiconductor designing technology, and more particularly, to a semiconductor memory device that performs a target refresh operation.

2. Description of the Related Art

A memory cell of a semiconductor memory device includes a transistor that functions as a switch and a capacitor that stores charges (or data). A data is determined to be at a logic high level (logic level 1) and at a logic low level (logic level 0) according to whether there is any charge in the capacitor of a memory cell, that is, whether the terminal voltage of the capacitor is high or low.

Data are stored in a form that charges are accumulated in a capacitor, and theoretically, there is no power consumption. However, since there may be a leakage current due to such reasons as a PN coupling of a transistor, the initial amount of charges stored in the capacitor may disappear, which leads to the loss of data. To prevent this from occurring, the data in a memory cell is typically read before the data get lost, and a normal amount of charge, according to the read data, is recharged back into the memory cell. With this approach, data may be retained only when such an operation is repeated periodically, and the process of recharging cell charges is referred to as a refresh operation (which will be, hereinafter, referred to as a normal refresh operation).

Recently, in addition to the normal refresh operation, an additional refresh operation (which will be, hereinafter, referred to as a 'target refresh operation') is being performed on the memory cells of a specific word line that is likely to lose data due to row hammering. The row hammering phenomenon refers to a phenomenon in which data of memory cells coupled to a specific word line or the word lines disposed adjacent to the word line are damaged due to a high number of activations of the corresponding word line. In order to prevent the row hammering phenomenon, a target refresh operation is performed on a word line that is activated more than a predetermined number of times (which is, hereinafter, referred to as a 'target word line'). A target refresh operation can also be performed on the word lines disposed adjacent to the word line.

SUMMARY

Embodiments of the present invention are directed to a semiconductor memory device capable of sampling an active address and storing it in a plurality of latches, and selecting a target address for a target refresh operation among latch addresses according to the number of active addresses that are repeatedly input.

In accordance with one embodiment of the present invention, a semiconductor memory device includes: an input control circuit suitable for providing an active address which is input together with an active command, as an input address; a plurality of latches suitable for sequentially storing, as a latch address, the input address according to input control signals and outputting the latch addresses as a target address according to output control signals; a plurality of counters respectively corresponding to the latches and each suitable for increasing, when the active address matches the latch address stored in the latch, a counting value corresponding to the latch; and a refresh controller suitable for dividing the counters and the latches into a plurality of groups based on the counting values and generating, in response to a refresh command, reset signals for initializing the counters included in one group of the groups.

In accordance with another embodiment of the present invention, a semiconductor memory device includes: a plurality of latches suitable for storing input addresses as latch addresses according to input control signals and outputting the latch addresses as target addresses according to output control signals; a plurality of address comparators suitable for comparing an active address with the latch addresses to generate a plurality of match signals; a plurality of counters suitable for respectively generating a plurality of counting signals according to the match signals and being initialized respectively according to a plurality of reset signals; a group decoder suitable for generating, based on the counting signals, a plurality of group signals and first to third group enable signals, each group signal being formed of first to third bits respectively representing first to third groups; a latch input control circuit suitable for generating the input control signals according to the match signals and null signals respectively indicating states of the counters; a latch output control circuit suitable for generating, according to a refresh command and the first to third group enable signals, the output control signals corresponding to the first and second bits of the group signals; and a reset control circuit suitable for generating, according to the refresh command, the reset signals corresponding to the third bit of the group signals.

In accordance with yet another embodiment of the present invention, a method for operating a semiconductor memory device includes: generating, by a plurality of counters, respective counting signals by counting respective match signals generated through comparison between an active address and latch addresses stored in respective latches when an active command is input; dividing the counters and the latches into a first group and a second group based on the counting signals; and outputting, as a target address, one of the latch addresses of the latches included in the first group and initializing the counters included in the second group, when a refresh command is input.

In accordance with another embodiment of the present invention, a semiconductor memory device includes: a row control circuit configured to perform a target refresh operation on a memory cell array according to a target refresh command and a target address; and a refresh control circuit configured to: latch an active address when the active address is not the same as any of latched addresses; increase, when the active address is the same as a specific one of the latched addresses, a count corresponding to the specific addresses; provide, in response to the target command, the row control circuit with any of the one or more latched addresses each corresponding to the count greater than a threshold as the target address while initializing the count corresponding to the provided address; provide, in response to the target command, the row control circuit with any of the one or more latched address each corresponding to the count less than the threshold as the target address when there is not any of the latch address corresponding to the count greater than the threshold; and initialize the count less than the threshold.

DETAILED DESCRIPTION

Figure 1:
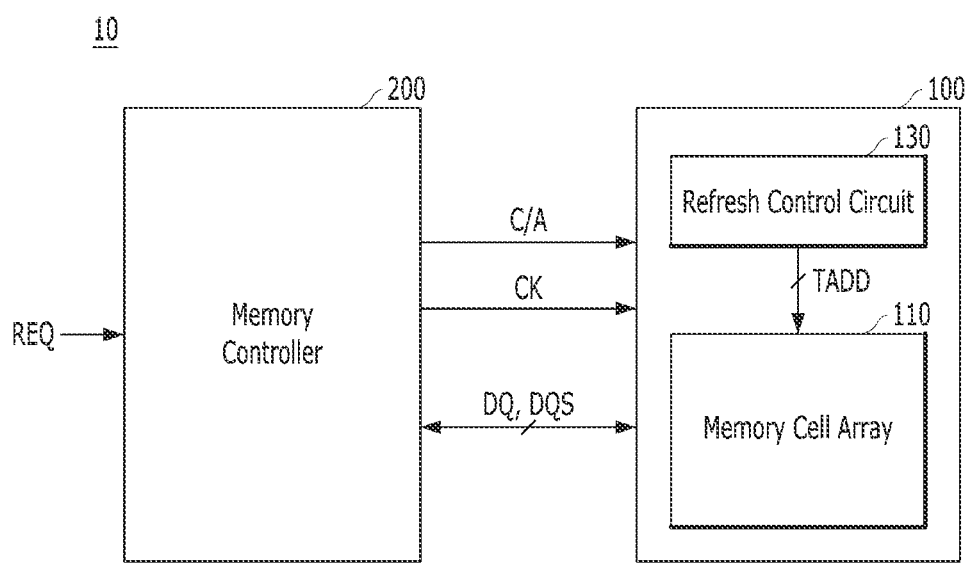
FIG. 1 is a block diagram illustrating a memory system in accordance with an embodiment of the present invention.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that when an element is referred to as being "coupled" or "connected" to another element, it may mean that the two are directly coupled or electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

In order to select a target word line to be refreshed during a target refresh operation, a memory device may need to count the number of times that an active address (which is input together with an active command) is input. When the number (or type) of the duplicated (or same) active addresses is small, the number of activations of each target word line per unit time may increase, thereby increasing a row hammer risk. In this case, it may be efficient to count all of the active addresses, the number of which is small. On the other hand, when the number (or type) of duplicated active addresses is large, the number of activations of each target word line per unit time may be small, which may reduce the row hammer risk but increase the burden on the memory device due to the increase in the area occupied by counting circuits and latch circuits for the respective active addresses, the number of which is large. Disclosed hereinafter is a scheme of efficiently managing counting circuits and latch circuits by counting all the active addresses when the number (or type) of the duplicated active addresses is small and by initializing the counting circuit corresponding to the latch circuit for each target refresh period when the number (or type) of the duplicated active addresses is large.

FIG. 1 is a block diagram illustrating a memory system 10 in accordance with an embodiment of the present invention.

Referring to FIG. 1, the memory system 10 may include a semiconductor memory device 100 and a memory controller 200.

The memory controller 200 may control the general operation of the memory system 10, and it may control general data exchange between a host and the semiconductor memory device 100. The memory controller 200 may generate a command/address signal C/A according to a request REQ from the host and provide the generated command/address signal C/A to the semiconductor memory device 100. The memory controller 200 may provide a clock CK together with the command/address signal C/A to the semiconductor memory device 100. The memory controller 200 may provide a data DQ corresponding to the request REQ which is provided from the host to the semiconductor memory device 100 together with a data strobe signal DQS. The memory controller 200 may receive the data DQ (which is read from the semiconductor memory device 100) together with a data strobe signal DQS and provide the data DQ and the data strobe signal DQS to the host.

The semiconductor memory device 100 may perform refresh, write, and read operations according to the clock CK, the command/address signal C/A, the data strobe signal DQS, and/or the data DQ that are provided from the memory controller 200. The refresh operation may include a normal refresh operation in which the semiconductor memory device 100 sequentially refreshes a plurality of word lines, and/or a target refresh operation in which one or more neighboring word lines disposed adjacent to a word line having a large number of activations or a high active frequency are refreshed.

The semiconductor memory device 100 may generate an internal command ICMD (refer to FIG. 2) and an internal address IADD (refer to FIG. 2) by buffering the command address signal C/A, and may generate an active command ACT (refer to FIG. 2) related to a row control operation, a precharge command PCG (refer to FIG. 2), a normal refresh command REF (refer to FIG. 2), and a target refresh command TREF (refer to FIG. 2) by decoding the command ICMD. The semiconductor memory device 100 may perform a normal refresh operation according to a normal refresh command REF and perform a target refresh operation according to a target refresh command TREF. The semiconductor memory device 100 may additionally generate commands related to data input/output operations (e.g., a read command or a write command) by decoding the internal command ICMD.

To be specific, the semiconductor memory device 100 may include a memory cell array 110 and a refresh control circuit 130, In the memory cell array 110, a plurality of memory cells coupled to a plurality of word lines and a plurality of bit lines may be arranged in the form of an array. The refresh control circuit 130 may provide a target address TADD for selecting, from the word lines, a word line to be refreshed. The refresh control circuit 130 may sample the active address ACT_ADD according to the active command ACT and output the sampled active address ACT_ADD as the target address TADD.

Figure 2:
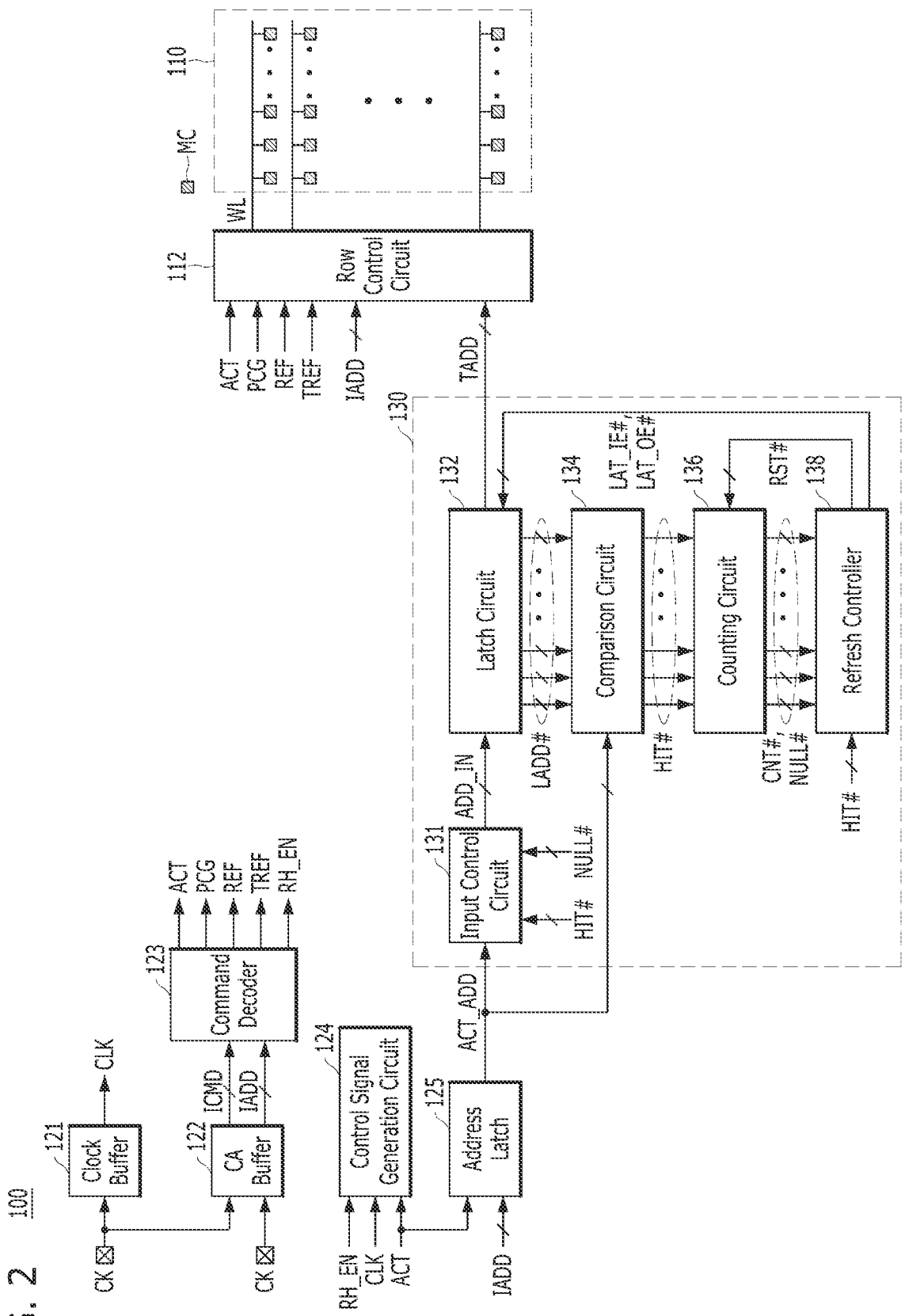
FIG. 2 is a detailed block diagram illustrating a semiconductor memory device shown in FIG. 1.

FIG. 2 is a detailed block diagram illustrating the semiconductor memory device 100 shown in FIG. 1.

Referring to FIG. 2, the semiconductor memory device 100 may include a memory cell array 110, a row control circuit 112, a dock buffer 121, a command/address CA buffer 122, and a command decoder 123, a control signal generation circuit 124, an address latch 125, and a refresh control circuit 130.

The memory cell array 110 may include memory cells MC coupled to word lines WL and bit lines. The memory cell array 110 may include a plurality of banks. The number of banks or the number of memory cells MC may be determined based on the capacity of the semiconductor memory device 100.

The clock buffer 121 may receive the clock CK from the memory controller 200. The clock buffer 121 may generate an internal clock CLK by buffering the clock CK. According to one embodiment of the present invention, the memory controller 200 may transfer system clocks CK_t and CK_c to the semiconductor memory device 100 in a differential manner, and the semiconductor memory device 100 may include clock buffers that receive the differential clocks CK_t and CK_c, respectively.

The CA buffer 122 may receive the command address signal C/A from the memory controller 200 based on the clock CK. The CA buffer 122 may sample the command/address signal C/A based on the clock CK and output the internal command ICMD and the internal address IADD. Consequently, the semiconductor memory device 100 may be synchronized with the dock CK.

The command decoder 123 may decode the internal command ICMD which is output from the CA buffer 122 to generate an active command ACT, a precharge command PCG, a normal refresh command REF, a target refresh command TREF, and a sampling enable signal RH_EN. The command decoder 123 may additionally generate a read command RD, a write command WT, a mode register command MRS, and the like by decoding the internal command ICMD, Herein, the target refresh command TREF may be generated whenever the normal refresh command REF is input a predetermined number of times. For example, whenever the normal refresh command REF is issued 4096 number of times, a target refresh command TREF may be generated.

The control signal generation circuit 124 may generate first to fourth active signals ACT0 to ACT3 that are sequentially activated according to the sampling enable signal RH_EN, the internal clock CLK, and the active command ACT. In other words, the control signal generation circuit 124 may generate four active signals ACT0 to ACT3 that are sequentially activated based on one active command ACT.

The detailed structure and operation of the control signal generation circuit 124 will be described later with reference to FIGS. 3 and 4.

The address latch 125 may latch the internal address IADD as the active address ACT_ADD according to the active command ACT.

The refresh control circuit 130 may sample the active addresses ACT_ADD according to the first to fourth active signals ACT0 to ACT3 to sequentially store a plurality of latch addresses LADD# (1≤#≤16), although more than sixteen latch addresses could be used, select one among the latch addresses LADD# according to the target refresh command TREF, and output the selected one as a target address TADD, In particular, according to one embodiment of the proposed invention, when the target refresh command TREF is activated, the refresh control circuit 130 may select one among the latch addresses LADD# according to the counting values obtained by counting the number of times that the active address ACT_ADD is repeatedly input, output the selected latch address LADD# as the target address TADD and initialize the counting values corresponding to some of the latch addresses LADD#.

To be specific, the refresh control circuit 130 may include an input control circuit 131, a latch circuit 132, a comparison circuit 134, a counting circuit 136, and a refresh controller 138.

The input control circuit 131 may provide the active address ACT_ADD as an input address ADD_IN to the latch circuit 132 according to the active command ACT.

Figure 6:
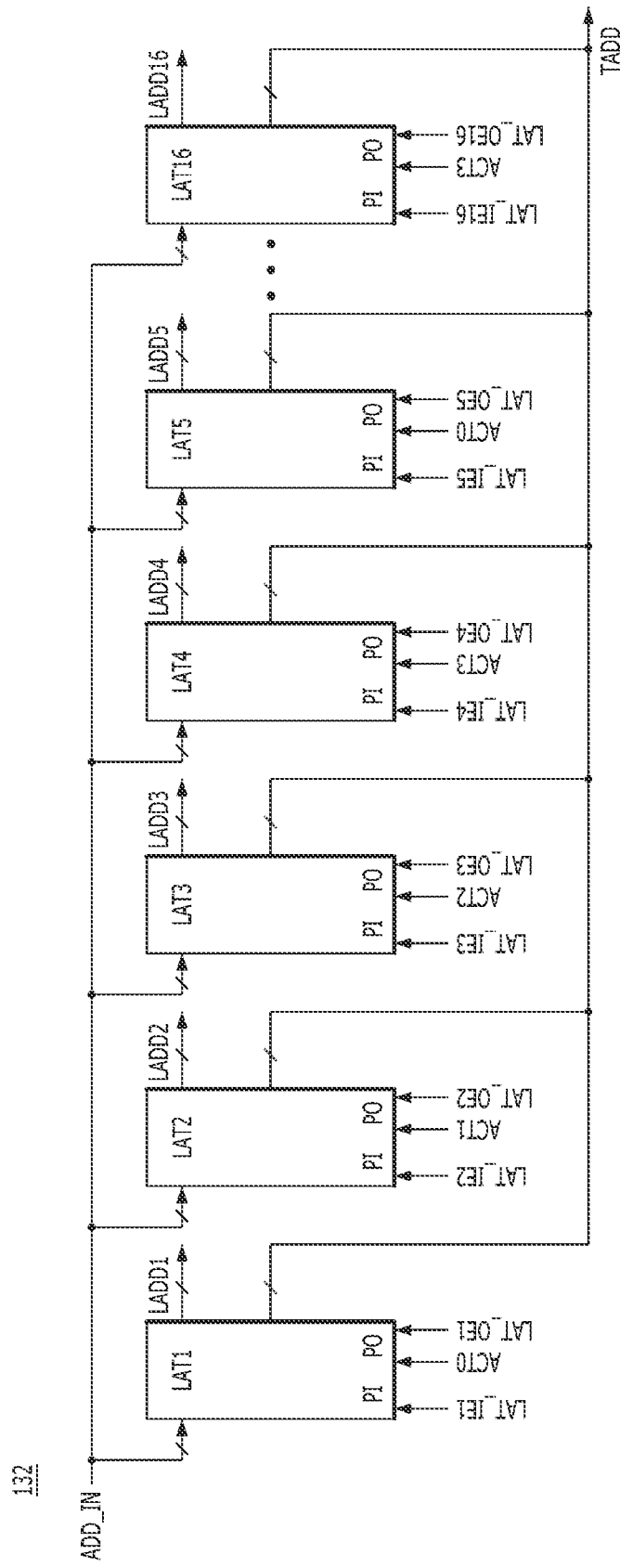
FIG. 6 is a detailed block diagram illustrating a latch circuit shown in FIG. 2.

The latch circuit 132 may include a plurality of latches (such as for example, LAT1 to LAT16 of FIG. 6). The latches LAT1 to LAT16 may sequentially store the input address ADD_IN according to the input control signal LAT_IE#, and output the latch addresses LADD# as the target address TADD according to the output control signal LAT_OE#. In particular, each of the latches LAT1 to LAT16 may receive one among the first to fourth active signals ACT0 to ACT3 and provide, when the received active signal is activated, the latch addresses LADD# to the comparison circuit 134. The detailed structure of the latch circuit 132 will be described later with reference to FIG. 6.

The comparison circuit 134 may generate a plurality of match signals HIT# by comparing the latch addresses LADD# with the active address ACT_ADD, respectively. The comparison circuit 134 may activate a corresponding match signal HIT# when the active address ACT_ADD matches a specific latch address LADD#. The detailed structure of the comparison circuit 134 will be described with reference to FIG. 7.

The counting circuit 136 may include a plurality of counters (such as for example, C1 to C16 of FIG. 8) respectively corresponding to the latches LAT1 to LAT16. The counters C1 to C16 may receive match signals HIT# and generate a plurality of counting signals CNT#. Each of the counters C1 to C16 may increase a corresponding counting value when the active address ACT_ADD matches the latch address ADD# stored in a corresponding latch and thus a corresponding match signal is activated. In particular, each of the counters C1 to C16 may correspond to one signal among the first to fourth active signals ACT0 to ACT3 and increase, when the corresponding active signal is activated, the corresponding counting value according to the corresponding match signal HIT#. The counters C1 to C16 may output a plurality of counting signals CNT# respectively corresponding to the counting values. Each of the counters C1 to C16 may be initialized according to a corresponding one among a plurality of reset signals RST#. Also, when the counting value of a counter C1 to C16 is zero, the counter C1 to C16 may output a plurality of null signals NULL# indicating that the current state is a null state at a logic high level. The detailed structure of the counting circuit 136 will be described later with reference to FIG. 8.

In one embodiment, the input control circuit 131 may randomly sample the active address ACT_ADD as a shadow address SDW_ADD (refer to FIG. 5) when it is determined, based on the match signals HIT# and the null signals NULL#, that the active address ACT_ADD does not match any of the latch addresses LADD# and all the latches LAT1 to LAT16 are in a full state. The input control circuit 131 may provide the shadow address SDW_ADD as the input address ADD_IN in response to the target refresh command TREF. Accordingly, the shadow address SDW_ADD may be stored in the latch in response to the target refresh command TREF. The detailed structure of the input control circuit 131 will be described later with reference to FIG. 5.

The refresh controller 138 may divide the counters C1 to C16 and the latches LAT1 to LAT16 into a plurality of groups based on the counting signals CNT#, For example, the refresh controller 138 may classify the counters each having a counting value equal to or greater than a threshold value into a first group, and classify the counters each having a counting value less than the threshold value into a second group. Alternatively, the refresh controller 138 may classify the counters each having a counting value equal to or greater than the first threshold value into a first group, classify the counters each having a counting value equal to or greater than the second threshold value and less than the first threshold value into a second group, and classify the counters each having a counting value less than the second threshold value into a third group.

The refresh controller 138 may generate, in response to the target refresh command TREF, the reset signals RST# for initializing only the counters included in one group. In this example, the one group may be a group of the counters each having a counting value less than the threshold value. Accordingly, the counters having a counting value less than the threshold value and thus belonging to the one group may be initialized every target refresh period.

Also, in response to the target refresh command TREF, the refresh controller 138 may generate an output control signal LAT_OE# to output, as the target address TADD, one latch address among the latch addresses LADD# of the latches LAT1 to LAT16 that are included in the remaining groups. Here in this example, the remaining groups may be the groups of the counters each having a counting value equal to or greater than the threshold value. Accordingly, one latch address corresponding to a large counting value may be output as a target address of the latch addresses LADD# of the latches. When any of the latches LAT1 to LAT16 does not belong to the remaining groups of the counters each having a counting value equal to or greater than a threshold value, the output control signal LAT_OE# may be generated to output the latch address LADD# of a specific latch, e.g., a first latch LAT1, as the target address TADD. Also, the refresh controller 138 may generate a reset signal for initializing a counter corresponding to a latch in which the latch address LADD# is output as the target address TADD.

Also, when one among the first to fourth active signals ACT0 to ACT3 or the target refresh command TREF is activated, the refresh controller 138 may generate an input control signal LAT_IE# to store the input address ADD_IN in one latch selected according to the match signals HIT# and the nulls signals NULL# of the latches LAT1 to LAT16. Here in this example, the refresh controller 138 may determine that the active address ACT_ADD does not match any of the latch addresses LADD# based on the match signals HIT#, generate the input control signal LAT_IE# to store the input address ADD_IN in one latch selected based on the null signals NULL# among the latches LAT1 to LAT16. The detailed structure of the refresh controller 138 will be described later with reference to FIGS. 9 to 11.

The row control circuit 112 may activate the word line WL corresponding to the internal address IADD when the active command ACT is activated, and when the precharge command PCG is activated, precharge the activated word line WL. In order to select a word line to be refreshed during a normal refresh operation, a refresh counter for generating counting addresses that sequentially increase according to the normal refresh command REF may be additionally provided. The row control circuit 112 may perform a normal refresh operation of sequentially refreshing a plurality of word lines WL corresponding to the counting addresses according to the normal refresh command REF. The row control circuit 112 may perform a target refresh operation of refreshing one or more neighboring word lines of the word line WL corresponding to the target address TADD according to the target refresh command TREF.

With the above structure, when the target address TADD is selected from the latch addresses LADD# of the latches LAT1 to LAT16 by sampling the active address ACT_ADD, the semiconductor memory device 100 may divide the counters C1 to C16 and the latches LAT1 to LAT16 into at least two groups based on the counting value which is obtained by counting the number of times that the active address ACT_ADD is repeatedly input. Also, the semiconductor memory device 100 may output one among the latch addresses LADD# of the latches belonging to the group of the counters each having a large counting value as a target address, and initialize the counters belonging to the group of the counters each having a small counting value at each target refresh period. In this way, it may be possible for the semiconductor memory device 100 to prevent unnecessary address comparison operations, which improves refresh efficiency.

Hereinafter, a detailed structure of each constituent element will be described with reference to FIGS. 3 to 11. Hereinafter, a case where the first to $16^{th}$ latches LAT1 to LAT16 are disposed in the latch circuit 132 and the first to $16^{th}$ counters C1 to C16 are disposed in the corresponding counting circuit 136 is taken as an example and described.

Figure 3:
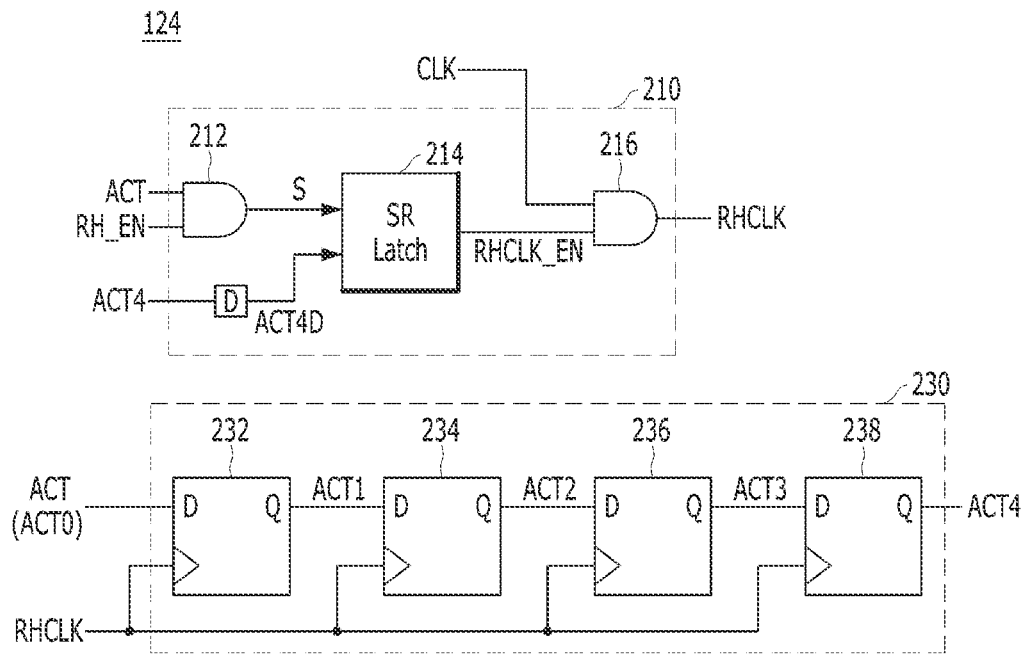
FIG. 3 is a detailed circuit diagram illustrating a control signal generation circuit shown in FIG. 2.

FIG. 3 is a detailed circuit diagram illustrating the control signal generation circuit 124 shown in FIG. 2. FIG. 4 is an operation waveform diagram illustrating the control signal generation circuit 124 shown in FIG. 3.

Referring to FIG. 3, the control signal generation circuit 124 may include a dock generation unit 210 and a signal generation unit 230.

The dock generation unit 210 may generate the target dock RHCLK based on the internal dock CLK when the sampling enable signal RH_EN and the active command ACT are activated. The dock generation unit 210 may deactivate the target dock RHCLK to a logic low level according to a delay signal ACT4D of the fifth active signal ACT4.

To be specific, the dock generation unit 210 may include a set signal generator 212, a delay D, an SR latch 214, and a clock generator 216.

The set signal generator 212 may generate a set signal S when both of the sampling enable signal RH_EN and the active command ACT are activated. According to one embodiment of the present invention, the set signal generator 212 may be realized as a logic AND gate. The delay D may generate a delay signal ACT4D by delaying the fifth active signal ACT4. The SR latch 214 may generate a clock enable signal RHCLK_EN that is activated according to the set signal S and deactivated according to the delay signal ACT4D. The clock generator 216 may output the internal clock CLK as the target clock RHCLK when the clock enable signal RHCLK_EN is activated. According to one embodiment of the present invention, the clock generator 216 may be realized as a logic AND gate.

The active command ACT may be provided as a first active signal ACT0 to the signal generator 230. The signal generator 230 may generate second to fifth active signals ACT1 to ACT4 by sequentially shifting the active command ACT according to the target clock RHCLK. For example, the signal generation unit 230 may include fourth flip-flops 232 to 238 that are coupled in series, shift the active command ACT in synchronization with the target clock RHCLK, and output the second to fifth active signals ACT1 to ACT4.

Figure 4:
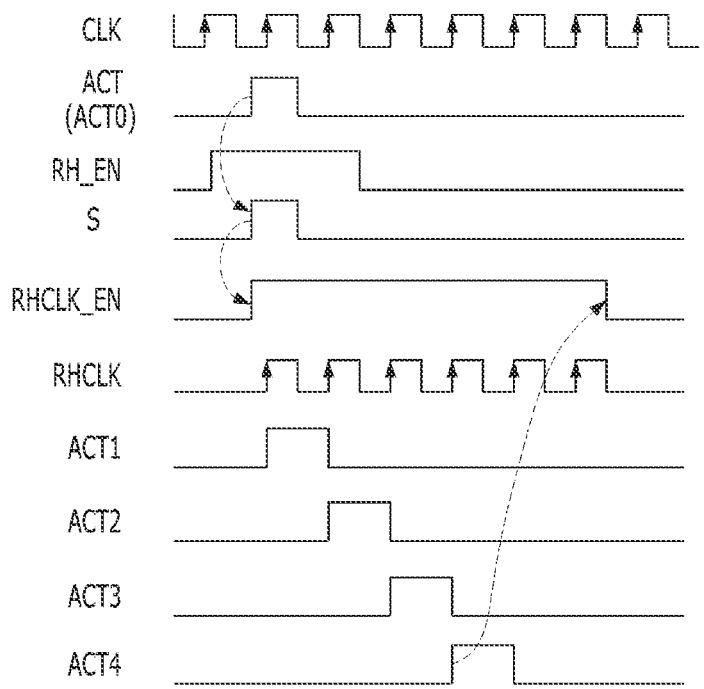
FIG. 4 is an operation waveform diagram of the control signal generation circuit shown in FIG. 3.

Referring to FIG. 4, with the above structure, the clock generation unit 210 may output the internal clock CLK as the target dock RHCLK when the sampling enable signal RH_EN and the active command ACT are activated. The signal generation unit 230 may generate the first to fifth active signals ACT0 to ACT4 by sequentially shifting the active command ACT as the target dock RHCLK toggles. The clock generation unit 210 may deactivate the target clock RHCLK to a logic low level according to the delay signal ACT4D of the fifth active signal ACT4. In other words, when one active command ACT is input, the control signal generation circuit 124 may output the first to fourth active signals ACT0 to ACT3 that are sequentially activated.

Hereinafter, in each drawing, the delay signals ACT0 to ACT3D may be defined as signals in which the first to fourth active signals ACT0 to ACT3 are delayed for a predetermined time.

Figure 5:
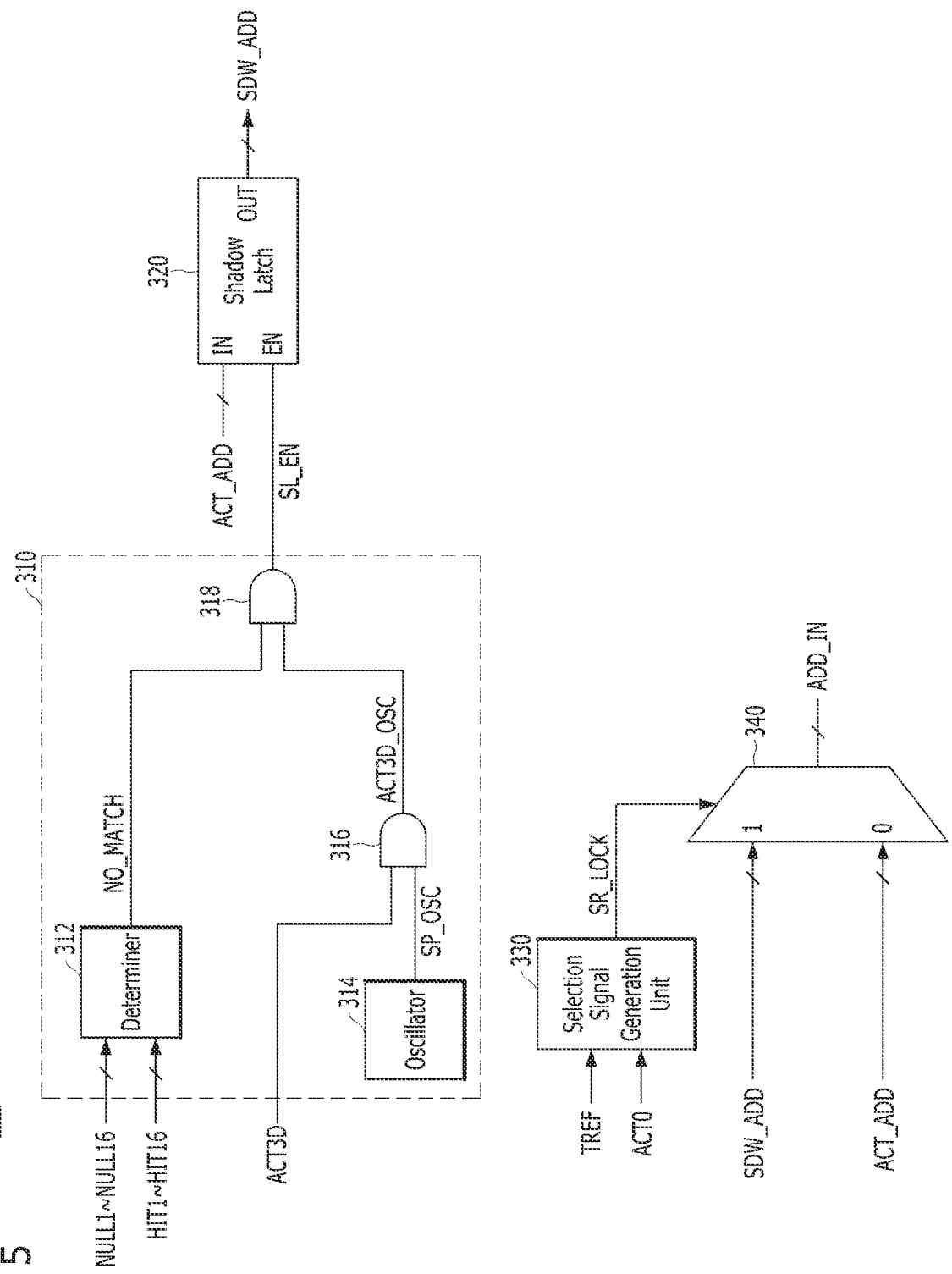
FIG. 5 is a detailed block diagram illustrating an input control circuit shown in FIG. 2.

FIG. 5 is a detailed block diagram illustrating the input control circuit 131 shown in FIG. 2.

Referring to FIG. 5, the input control circuit 131 may include an enable signal generation unit 310, a shadow latch unit 320, a selection signal generation unit 330, and an address output unit 340.

The enable signal generation unit 310 may determine whether the active address ACT_ADD matches all latch addresses LADD1 to LADD16 or not and whether all the latches LAT1 to LAT16 are in a full state or not based on the first to $16^{th}$ match signals HIT1 to HIT16 and the first to $16^{th}$ null signals NULL1 to NULL16. For example, when all of the first to $16^{th}$ match signals HIT1 to HIT16 are deactivated to a logic low level and when the first to $16^{th}$ null signals NULL1 to NULL16 are deactivated to a logic low level, the enable signal generation unit 310 may determine that the active address ACT_ADD does not match any of the latch addresses LADD1 to LADD16, and all the latches LAT1 to LAT16 are in a full state. In this example, the enable signal generation unit 310 may generate the latch enable signal SL_EN according to the fourth active signal ACT3 and the oscillating signal SP_OSC.

In one embodiment, the enable signal generation unit 310 may include a determiner 312, an oscillator 314, a first combiner 316, and a second combiner 318.

The determiner 312 may generate a mis-match signal NO_MATCH based on the first to $16^{th}$ match signals HIT1 to HIT16 and the first to $16^{th}$ null signals NULL1 to NULL16. When all the first to $16^{th}$ match signals HIT1 to HIT16 and the first to $16^{th}$ null signals NULL1 to NULL16 are at a logic low level, the determiner 312 may generate the mis-match signal NO_MATCH which is activated to a logic high level. According to one embodiment of the present invention, the determiner 312 may be realized as a NOA gate that performs a logic NOR operation on the first to $16^{th}$ match signals HIT1 to HIT16 and the first to $16^{th}$ null signals NULL1 to NULL16. The oscillator 314 may generate an oscillating signal SP_OSC that is activated at a predetermined period. When all the delay signal ACT3D of the fourth active signal ACT3 and the oscillating signal SP_OSC are activated, the first combiner 316 may activate and output a first combination signal ACT3D_OSC. When the mismatch signal NO_MATCH is activated, the second combiner 318 may generate the latch enable signal SL_EN according to the first combination signal ACT3D_OSC. According to one embodiment of the present invention, the first combiner 316 and the second combiner 318 may be realized as logic AND gates.

The shadow latch unit 320 may store the active address ACT_ADD as a shadow address SDW_ADD according to the latch enable signal SL_EN. According to one embodiment of the present invention, the shadow latch unit 320 may include a plurality of latches and may sequentially store a plurality of shadow addresses SDW_ADD.

The selection signal generation unit 330 may generate a selection signal SR_LOCK that is activated according to the target refresh command TREF and deactivated according to the first active signal ACT0, that is, the active command ACT. According to one embodiment of the present invention, the selection signal generation unit 330 may be realized as an SR latch.

The address output unit 340 may select one from the active address ACT_ADD and the shadow address SDW_ADD according to the selection signal SR_LOCK and output the input address ADD_IN.

With the above structure, when the active command ACT is input, the input control circuit 131 may provide the active address ACT_ADD to the latch circuit 132 as the input address ADD_IN. Here in this example, when the active address ACT_ADD does not match any of the latch addresses LADD1 to LADD16 and all the latches LAT1 to LAT16 are in a full state, the input control circuit 131 may randomly sample the active address ACT_ADD as a shadow address SDW_ADD. When the target refresh command TREF is activated, the input control circuit 131 may provide the shadow address SDW_ADD to the latch circuit 132 as the input address ADD_IN. In other words, the semiconductor memory device 100 according to one embodiment of the present invention may sample, by using the separate shadow latch 320, the active address ACT_ADD that is not stored in the latches during one target refresh period, thus maximizing the accuracy of the address sampling.

FIG. 6 is a detailed block diagram illustrating a latch circuit shown in FIG. 2.

Referring to FIG. 6, the latch circuit 132 may include the first to $16^{th}$ latches LAT1 to LAT16. The first to $16^{th}$ latches LAT1 to LAT16 may sequentially store the input address ADD_IN according to the corresponding signal among the first to $16^{th}$ input control signals LAT_IE1 to LAT_IE6, respectively.

Meanwhile, among the first to $16^{th}$ latches LAT1 to LAT16, the first latch LAT1, the fifth latch LAT5, the ninth latch LAT9, and the $13^{th}$ latch LAT13 may receive the first active signal ACT0. The second latch LAT2, the sixth latch LATE, the $10^{th}$ latch LAT10, and the $14^{th}$ latch LAT14 may receive the second active signal ACT1. The third latch LAT3, the seventh latch LAT7, the $11^{th}$ latch LAT11, and the 15th latch LAT15 may receive the third active signal ACT2. The fourth latch LAT4, the eighth latch LAT8, and the 12th latch LAT12, and the 16th latch LAT16 may receive the fourth active signal ACT3. In other words, four latches of the first to 16th latches LAT1 to LAT16 may receive the same active signal.

Accordingly, the first to 16th latches LAT1 to LAT16 may respectively output one latch address among the first to 16th latch addresses LADD1 to LADD16 as the target address TADD according to the corresponding signal among the first to 16th output control signals LAT_OE1 to LAT_OE16 and provide the first to 16th latch addresses LADD1 to LADD16 to the comparison circuit 134 according to the first to fourth active signals ACT0 to ACT3. Here in this example, since the first to fourth active signals ACT0 to ACT3 are sequentially activated, four of the first to 16th latch addresses LADD1 to LADD16 may be provided to the comparison circuit 134 at the same timing.

Figure 7:
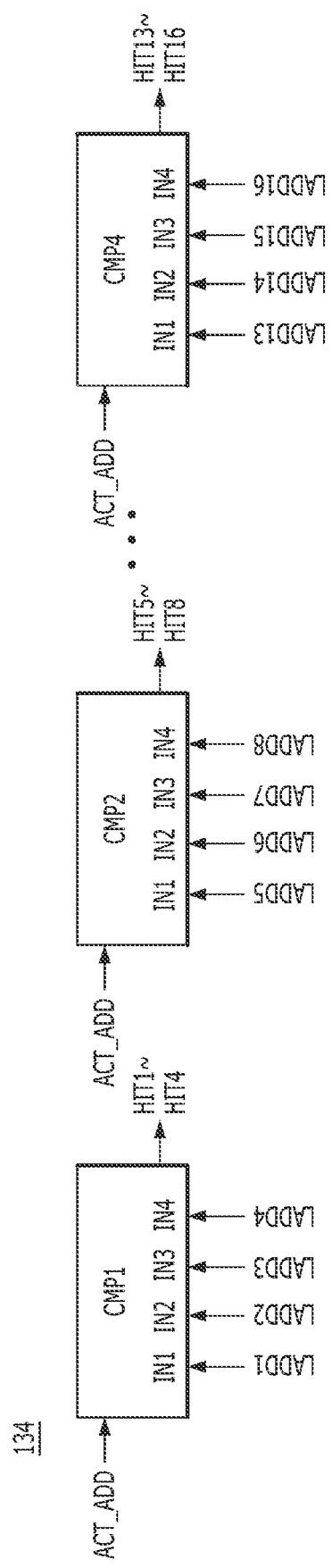
FIG. 7 is a detailed block diagram illustrating a comparison circuit shown in FIG. 2.

FIG. 7 is a detailed block diagram illustrating the comparison circuit 134 shown in FIG. 2.

Referring to FIG. 7, the comparison circuit 134 may include first to fourth address comparators CMP1 to CMP4. Each of the first to fourth address comparators CMP1 to CMP4 may receive four addresses among the first to 16th latch addresses LADD1 to LADD16, and compare the received latch addresses with the active address ACT_ADD to generate the first to 16th match signals HIT1 to HIT16. For example, the first address comparator CMP1 may generate first to fourth match signals HIT1 to HIT4 by comparing the first to fourth latch addresses LADD1 to LADD4 with the active addresses ACT_ADD. Herein, since four of the first to 16th latch addresses LADD1 to LADD16 are provided at the same timing, the first to fourth address comparators CMP1 to CMP4 may independently perform the comparison operation four times.

In other words, the semiconductor memory device 100 according to this embodiment of the present invention may perform a comparison operation sequentially by using the first to fourth active signals ACT0 to ACT3 that are sequentially activated, thus reducing the area occupied by the comparison circuit.

Figure 8:
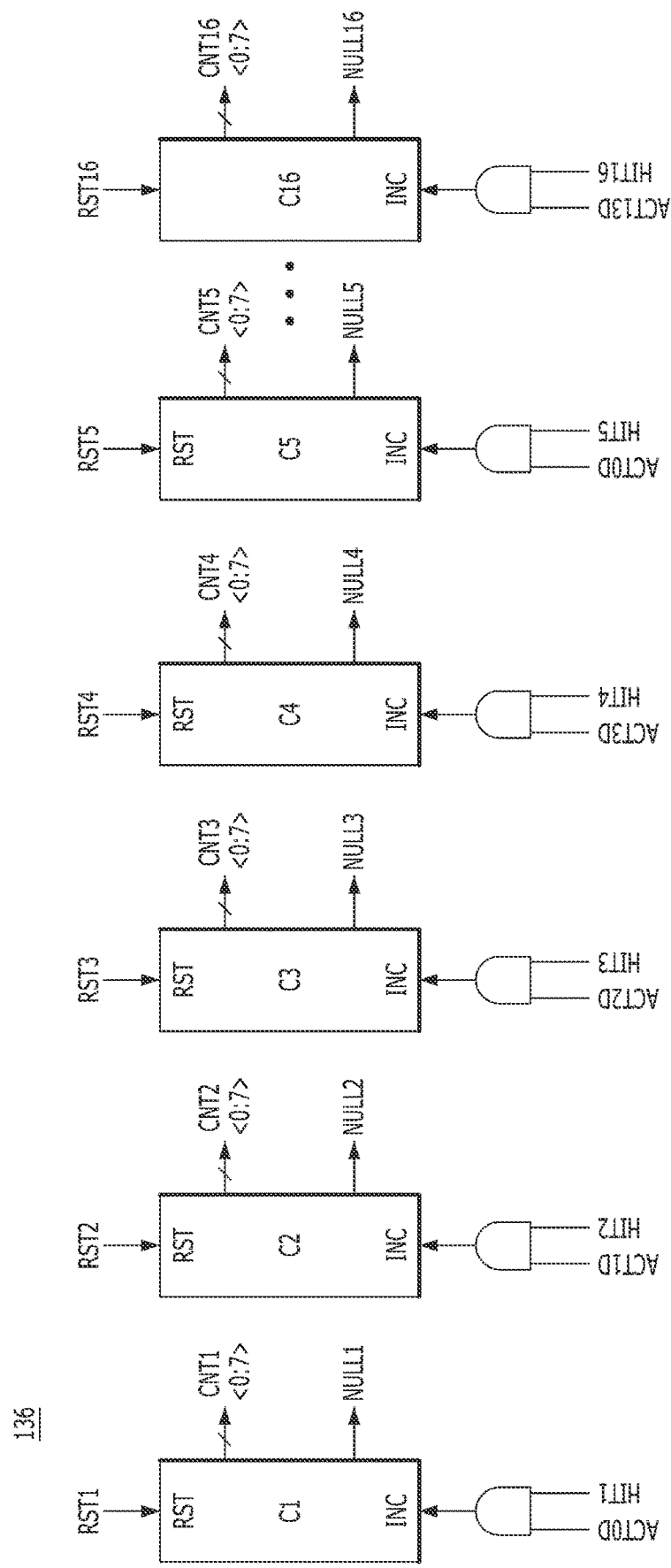
FIG. 8 is a detailed block diagram illustrating a counting circuit shown in FIG. 2.

FIG. 8 is a detailed block diagram illustrating the counting circuit 136 shown in FIG. 2.

Referring to FIG. 8, the counting circuit 136 may include first to 16th counters C1 to C16.

Among the first to 16th counters C1 to C16, the first counter C1, the fifth counter C5, the ninth counter C9, and the 13th counter C13 may receive a delay signal ACT0D of the first active signal ACT0. The second counter C2, the sixth counter C6, the 10th counter C10, and the 14th counter C14 may receive a delay signal ACT1D of the second active signal ACT1. The third counter C3, the seventh counter C7, the 11th counter C11, and the 15th counter C15 may receive a delay signal ACT2D of the third active signal ACT2. The fourth counter C4, the eighth counter C8, the 12th counter C12, and the 16th counter C16 may receive a delay signal ACT3D of the fourth active signal ACT3. In short, four of the first to 16th counters C1 to C16 may receive the same active signal. Here in this example, the counting circuit 136 may perform a counting operation after the comparison operation of the comparison circuit 134 is completed by receiving the delay signals of the active signals.

When the corresponding signal of the first to 16th match signals HIT1 to HIT16 and the corresponding active signal are all activated, the first to 16th counters C1 to C16 may increase the counting value by one and output the corresponding first to 16th counting signals CNT1<0:7> to CNT16<0:7>. Also, when any of the counting values is zero, a corresponding one of the first to 16th counters C1 to C16 may activate to a logic high level and output a corresponding null signal indicating that the current state of the corresponding counter is a null state of the first to 16th null signals NULL1 to NULL16, Also, the first to 16th counters C1 to C16 may be initialized respectively according to the first to 16th reset signals RST1 to RST16. In FIG. 8, a case where each of the first to 16th counters C1 to C16 is realized as an 8-bit counter is described as an example.

Figure 9:
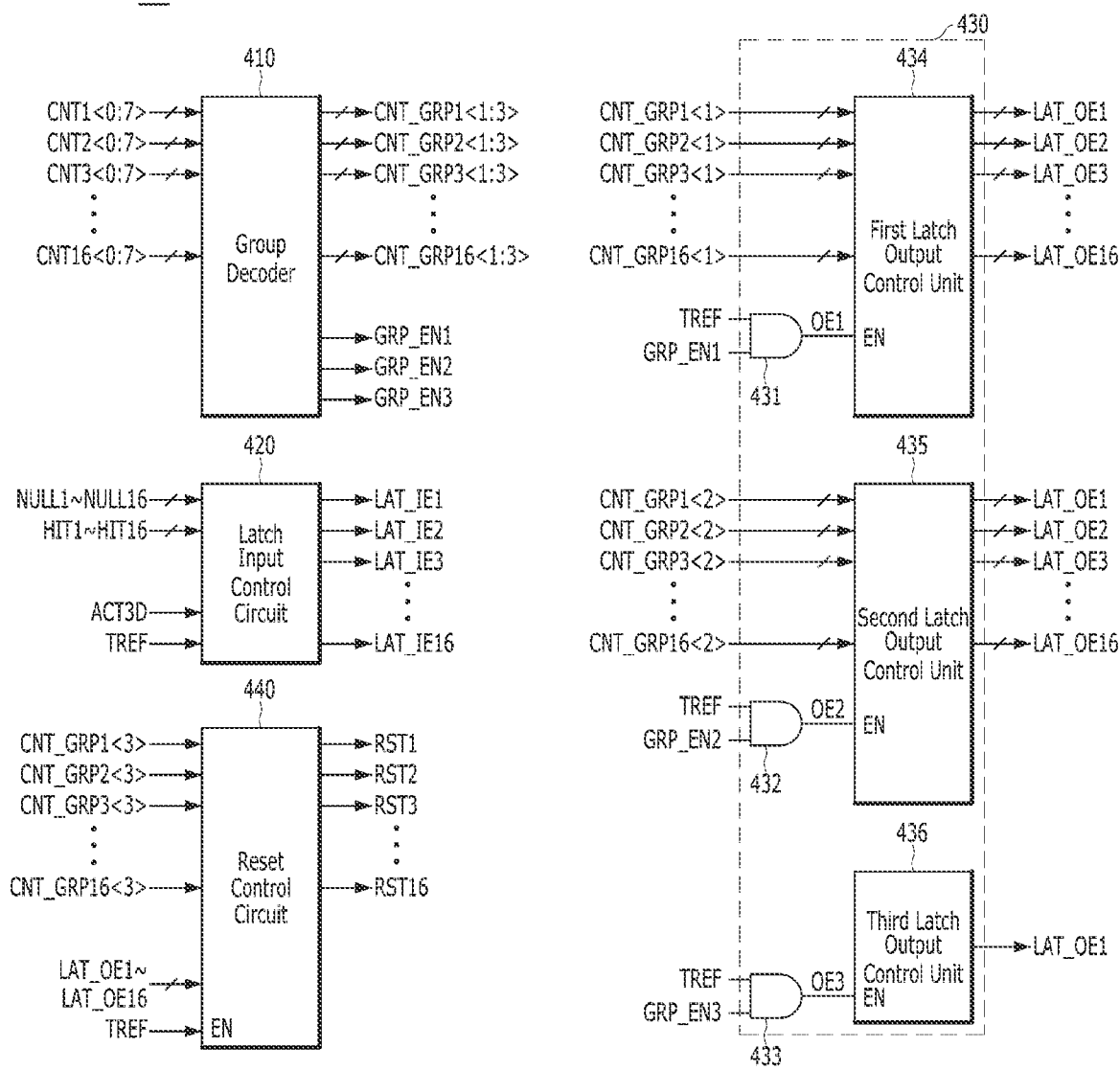
FIG. 9 is a detailed block diagram illustrating a refresh controller shown in FIG. 2.
Figure 10:
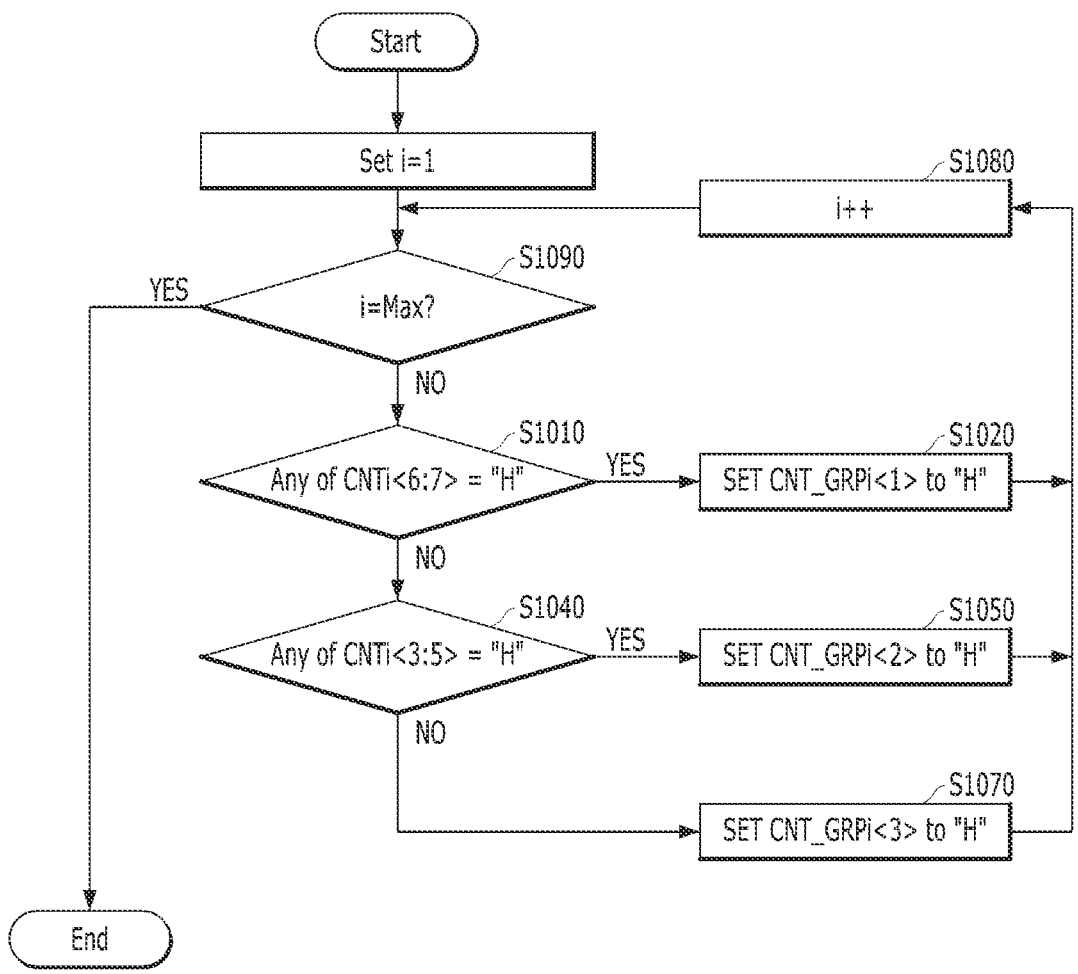
FIG. 10 is a flowchart describing an operation of a group decoder shown in FIG. 9.
Figure 11:
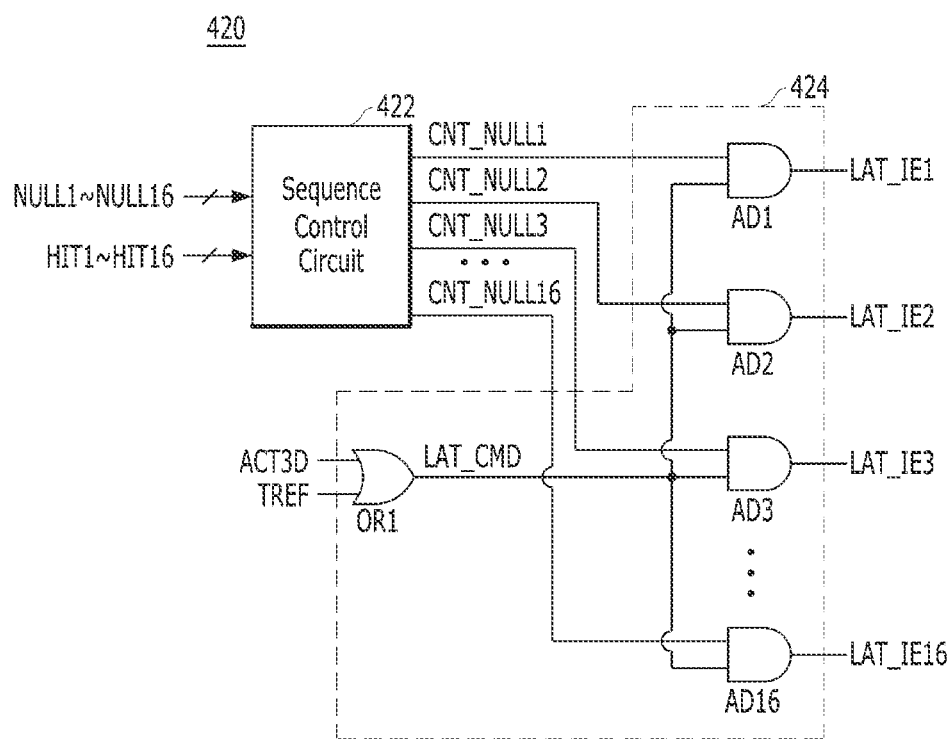
FIG. 11 is a detailed circuit diagram illustrating a latch input control circuit shown in FIG. 9.

FIG. 9 is a detailed block diagram illustrating the refresh controller 138 shown in FIG. 2. FIG. 10 is a flowchart describing an operation of a group decoder 410 shown in FIG. 9. FIG. 11 is a detailed circuit diagram illustrating the latch input control circuit 420. In the following embodiment, a case where the refresh controller 138 divides the counters and the latches into first to third groups will be described as an example.

Referring to FIG. 9, the refresh controller 138 may include a group decoder 410, a latch input control circuit 420, a latch output control circuit 430, and a reset control circuit 440.

The group decoder 410 may generate the first to 16th group signals CNT_GRP1<1:3> to CNT_GRP16<1:3> and the first to third group enable signals GRP_EN1 to GRP_EN3 based on the first to 16th counting signals CNT1<0:7> to CNT16<0:7>. When the first to 16th counting signals CNT1<0:7> to CNT16<0:7> are equal to or greater than a first threshold value (e.g., 64), the group decoder 410 may classify the corresponding counters into a first group. When the first to 16th counting signals CNT1<0:7> to CNT16<0:7> are equal to or is greater than a second threshold value (e.g., 8) and less than the first threshold value, the group decoder 410 may classify the corresponding counters into a second group. When the first to 16th counting signals CNT1<0:7> to CNT16<0:7> are less than the second threshold value (e.g., 8), the group decoder 410 may classify the corresponding counters into a third group.

For example, referring to FIG. 10, when any one bit of the most significant 2-bits (e.g., CNT1<6:7>) of the first counting signal CNT1<0:7> is a logic high bit (YES in step S1010), the group decoder 410 may define the first counter C1 and the first latch LAT1 corresponding to the first counter C1 as a first group by setting the least significant bit CNT_GRP1<1> of the first group signal CNT_GRP1<1:3> to a logic high level in step S1020. When the most significant 2-bits (e.g., CNT1<6:7>) are all logic low bits (NO in step S1010) and when any one bit of the 3 bits in the middle of the first counting signal (CNT1<0:7>) CNT1<3:5> to CNT1<3:5>) is a logic high bit (YES in step S1040), the group decoder 410 may define the first counter C1 and the first latch LAT1 corresponding to the first counter C1 as a second group by setting the middle bit CNT_GRP1<2> of the first group signal CNT_GRP1<1:3> to a logic high level in step S1050. Also, when the most significant 2-bits (e.g., CNT1<6:7>) and the 3-bits in the middle (e.g., CNT1<3:5> to CNT1<3:5>) are all logic low bits (NO in step S1040), the group decoder 410 may define the first counter C1 and the first latch LAT1 corresponding to the first counter C1 as a third group by setting the most significant bit CNT_GRP1<3> of the first group signal CNT_GRP1<1:3> to a logic high level in step S1070. The group decoder 410 may repeatedly perform the above operations of the steps S1010 to S1070) on the second to 16th counting signals CNT2<0:7> to CNT16<0:7> in steps S1080 and S1090 so as to divide the counters C1 to C16 and the latches LAT1 to LAT16 into first to third groups.

Referring back to FIG. 9, when any one of the least significant bits CNT_GRP1<1> to CNT_GRP16<1> is a logic high bit, the group decoder 410 may activate a first group enable signal GRP_EN1 to a logic high level. On the other hand, when any one of the middle bits CNT_GRP1<2> to CNT_GRP16<2> is a logic high bit in a state that the first group enable signal GRP_EN1 is at a logic low level, that is, while the least significant bits CNT_GRP1<1> to CNT_GRP16<1> are all logic low bits, the group decoder 410 may activate a second group enable signal GRP_EN2 to a logic high level. Also, when both of the first group enable signal GRP_EN1 and the second group enable signal GRP_EN2 are deactivated to a logic low level, a third group enable signal GRP_EN3 may be activated to a logic high level.

When the fourth active signal ACT3 or the target refresh command TREF is activated, the latch input control circuit 420 may generate the first to $16^{th}$ input control signals LAT_IE1 to LAT_IE16 according to the first to $16^{th}$ match signals HIT1 to HIT16 and the first to $16^{th}$ null signals NULL1 to NULL16.

For example, referring to FIG. 11, the latch input control circuit 420 may include a sequence control circuit 422 and a signal output circuit 424.

The sequence control circuit 422 may control the order of the first to $16^{th}$ null signals NULL1 to NULL16 according to the first to $16^{th}$ match signals HIT1 to HIT16 to generate one among first to $16^{th}$ sequential null signals CNT_NULL1 to CNT_NULL16. For example, when all of the first to $16^{th}$ match signals HIT1 to HIT16 are deactivated to a logic low level, the sequence control circuit 422 may activate and output one among the first to $16^{th}$ sequential null signals CNT_NULL1 to CNT_NULL16, which respectively correspond to the first to $16^{th}$ null signals NULL1 to NULL16, according to a predetermined order (e.g., sequential order).

When the fourth active signal ACT3 or the target refresh command TREF is activated, the signal output circuit 424 may output the first to $16^{th}$ sequential null signals CNT_NULL1 to CNT_NULL16 as first to $16^{th}$ input control signals LAT_TE1 to LAT_IE16. For example, the signal output circuit 424 may include a logic OR gate OR1 that generates a latch command signal LAT_CMD by performing a logic OR operation on the fourth active signal ACT3D and the target refresh command TREF, and a plurality of logic AND gates AD1 to AD16 that perform a logic AND operation on the latch command signal LAT_CMD and the first to $16^{th}$ sequential null signals CNT_NULL1 to CNT_NULL16, respectively.

With the above structure, when the fourth active signal ACT3D or the target refresh command TREF is activated, the latch input control circuit 420 may determine a case where any of the latch addresses LADD1 to LADD16 does not match the active address ACT_ADD based on the first to $16^{th}$ match signals HIT1 to HIT16, and sequentially output the first to $16^{th}$ input control signals LATE_IE1 to LAT_IE16 corresponding to the first to $16^{th}$ null signals NULL1 to NULL16 according to the predetermined order (for example, sequential order).

Referring back to FIG. 9, when the target refresh command TREF is activated, the latch output control circuit 430 may generate first to $16^{th}$ output control signal LAT_OE1 to LAT_OE16 based on the first to third group enable signals GRP_EN1 to GRP_EN3, and the least significant bits CNT_GRP1<1> to CNT_GRP16<1> and the middle bits CNT_GRP1<2> to CNT_GRP16<2> of the first to $16^{th}$ group signals CNTGRP1<1:3> to CNTGRP16<1:3>.

To be specific, the latch output control circuit 430 may include first to third signal combination units 431 to 433 and first to third latch output control units 434 to 436.

The first signal combination unit 431 may activate the first output enable signal OE1 when the target refresh command TREF and the first group enable signal GRP_EN1 are all activated. The second signal combination unit 432 may activate the second output enable signal OE2 when the target refresh command TREF and the second group enable signal GRP_EN2 are all activated. The third combination unit 433 may activate the third output enable signal OE3 when both the target refresh command TREF and the third group enable signal GRP_EN3 are all activated.

When the first output enable signal OE1 is activated, the first latch output control unit 434 may output the first to $16^{th}$ output control signals LAT_OE1 to LAT_OE16 which respectively correspond to the least significant bits CNT_GRP1<1> to CNT_GRP16<1>. Whenever the first output enable signal OE1 is activated, the first latch output control unit 434 may sequentially select one among the least significant bits CNT_GRP1<1> to CNT_GRP16<1> and output the selected one as a corresponding output control signal. When the second output enable signal OE2 is activated, the second latch output control unit 435 may output the first to $16^{th}$ output control signals LAT_OE1 to LAT_OE16 which respectively correspond to the middle bits CNT_GRP1<2> to CNTGRP16<2<. Whenever the second output enable signal OE2 is activated, the second latch output control unit 435 may sequentially select one among the middle bits CNT_GRP1<2> to CNT_GRP16<2> and output the selected one as a corresponding output control signal. When the third output enable signal OE3 is activated, the third latch output control unit 436 may output the first output control signal LAT_OE1. According to one embodiment of the present invention, the third latch output control unit 436 may sequentially activate one among the first to $16^{th}$ output control signals LAT_OE1 to LAT_OE16 whenever the third output enable signal OE3 is activated.

With the above structure, the latch output control circuit 430 may generate the first to $16^{th}$ output control signals LAT_OE1 to LAT_OE16 so that one among the latch addresses of the latches belonging to a group (which is the first or second group) of the counters each having a large counting value is output as a target address TADD, Here in this example, when there are no latches belonging to the group (which is the first or second group) of the counters each having a large counting value, the latch output control circuit 430 may generate the first output control signal LAT_OE1 so that the latch address LADD1 of the first latch LAT1 is output as the target address TADD.

When the target refresh command TREF is activated, the reset control circuit 440 may generate a reset signal corresponding to the activated output control signal among the first to $16^{th}$ reset signals RST1 to RST16. Also, after the target refresh command TREF is activated, the reset control circuit 440 may generate the first to $16^{th}$ reset signals RST1 to RST16 respectively corresponding to the most significant bits CNT_GRP1<3> to CNT_GRP16<3> of the first to $16^{th}$ group signals CNT_GRP1<1:3> to CNT_GRP16<1:3>. In other words, the reset control circuit 440 may generate reset signals for initializing only the counters included in the third group at each target refresh period.

Hereinafter, an operation of a memory device in accordance with one embodiment of the present invention will be described with reference to FIGS. 2 to 14.

Figure 12:
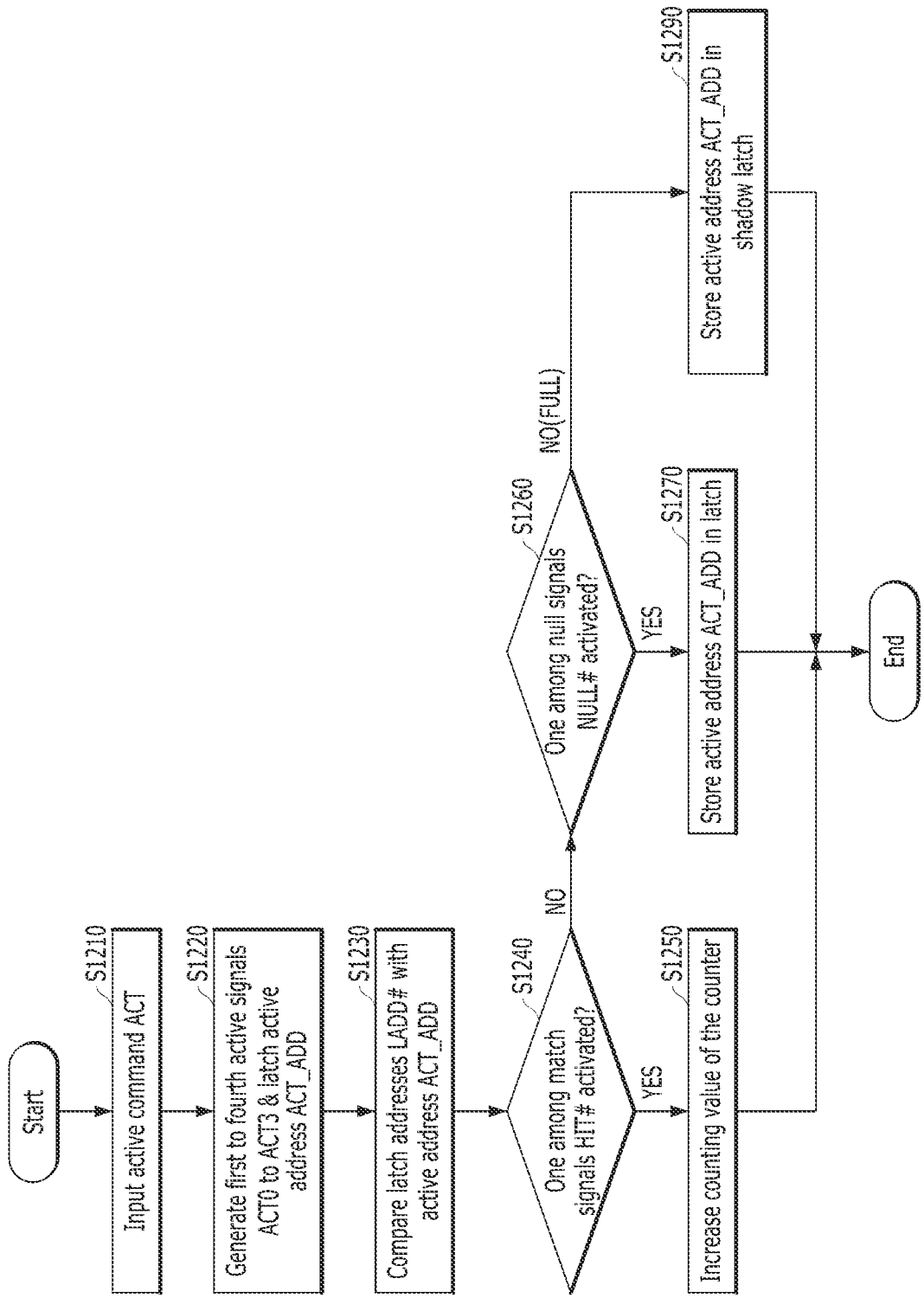
FIGS. 12 and 13 are flowcharts describing an operation of a memory device in accordance with one embodiment of the present invention.

FIG. 12 is a flowchart describing an operation of a semiconductor memory device in accordance with one embodiment of the present invention when an active command ACT is input.

Referring to FIG. 12, when the active command ACT is input in step S1210, the control signal generation circuit 124 may generate first to fourth active signals ACT0 to ACT3 that are sequentially activated, and the addresses latch 125 may latch the internal address IADD as the active address ACT_ADD in step S1220.

According to the first to fourth active signals ACT0 to ACT3, the latches LAT1 to LAT16 may provide latch addresses LADD1 to LADD16 to the comparison circuit 134, and the comparison circuit 134 may generate a plurality of match signals HIT1 to HIT16 by comparing the latch addresses LADD1 to LADD16 with the active address ACT_ADD in step S1230. Herein, when any one match signal HIT1 is activated (YES in step S1240), the corresponding counter C1 may increase the corresponding counting value in step S1250.

In one embodiment, when the active command ACT is input, the input control circuit 131 may provide the active address ACT_ADD to the latch circuit 132 as the input address ADD_IN.

In a state that all the match signals HIT1 to HIT16 are deactivated (NO in step S1240), when any one null signal NULLk among the null signals NULL1 to NULL16 is activated (YES in step S1260), the latch input control circuit 420 of the refresh controller 138 may generate input control signals LAT_IE1 to LAT_1E16 corresponding to the null signals NULL1 to NULL16. In this case, the activated signal NULLk among the null signals NULL1 to NULL16 may be provided as an input control signal LAT_IEk according to a predetermined order (e.g., sequential order). The corresponding latch LATk among the latches LAT1 to LAT16 may store the input address ADD_IN according to the input control signal LAT_IEk in step 5S1270.

In one embodiment in a state that all the match signals HIT1 to HIT16 are deactivated (NO in step S1240), when all the null signals NULL1 to NULLI6 are deactivated (NO in step S1260), the input control circuit 131 may determine that all the latches LAT1 to LAT16 are in a full state and store the active address ACT_ADD as a shadow address SDW_ADD in step S1290.

As described above, when the active command ACT is input, t may be determined whether there is a latch address the same as the active address ACT_ADD, and according to the determination result, the counting value indicating the number of repeated inputs of the active address ACT_ADD may be increased or the active address ACT_ADD may be stored in an empty latch. In one embodiment, the active address ACT_ADD that is not stored in the latches during one target refresh period may be stored as a separate shadow address SDW_ADD.

Figure 13:
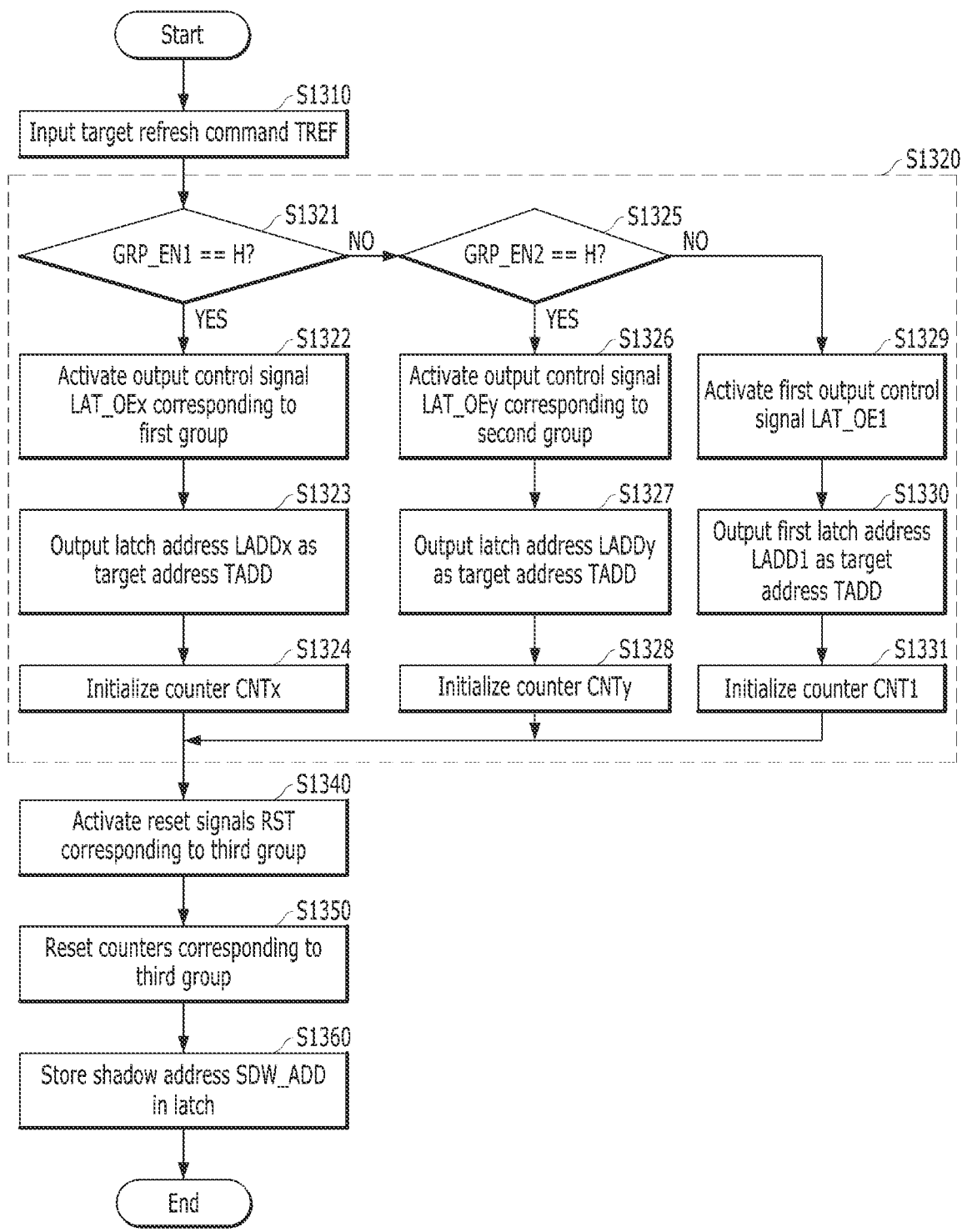

FIG. 13 is a flowchart illustrating an operation of a semiconductor memory device in accordance with one embodiment of the present invention when a target refresh command TREF is input.

Referring to FIG. 13, when the target refresh command TREF is input in step S1310, the latch output control circuit 430 of the refresh controller 138 may generate the output control signals LAT_OE1 to LAT_OE16 so that one among the latch addresses of the latches belonging to the group having a large counting value (which is the first or second group) is output as the target address TADD in step S1320.

To be specific, when the first group enable signal GRP_EN1 is activated (YES in step S1321), the first latch output control unit 434 may activate the output control signal LAT_OEx based on one among the activated bits of the least significant bits CNT_GRP1<1> to CNT_GRP16<1> corresponding to the first group in step S1322. The latch LATx receiving the output control signal LAT_OEx may output the stored latch address LADDx as the target address TADD in step S1323. The reset control circuit 440 may generate a reset signal RSTx corresponding to the activated output control signal LAT_OEx, and as a result, only the corresponding counter Cx among the counters C1 to C16 may be initialized in step S1324.

When the first group enable signal GRP_EN1 is deactivated (NO in step S1321) and the second group enable signal GRP_EN2 is activated (YES in step S1325), the second latch output control unit 435 may activate an output control signal LAT_OEy according to one among the activated bits of the middle bits CNT_GRP1<2> to CNT_GRP16<2> corresponding to the second group in step S1326. The latch LATy receiving the output control signal LAT_OEy may output the stored latch address LADDy as the target address TADD in step S1327. The reset control circuit 440 may generate a reset signal RSTy corresponding to the activated output control signal LAT_OEy, and as a result, only the corresponding counter Cy among the counters C1 to C16 may be initialized in step S1328.

When the first group enable signal GRP_EN1 is deactivated (NO in step S1321) and the second group enable signal GRP_EN2 is also deactivated (NO in step S1325), the third group enable signal GRP_EN3 may be activated. The third latch output control unit 436 may activate the first output control signal LAT_OE1 in step S1329. The first latch LAT1 may output the stored latch address LADD1 as the target address TADD in step S1330. The reset control circuit 440 may generate a first reset signal RST1 corresponding to the first output control signal LAT_OE1, and as a result, only the first counter C1 may be initialized in step S1331.

The reset control circuit 440 may generate the first to $16^{th}$ reset signals RST1 to RST16 corresponding to the activated bits of the most significant bits CNT_GRP1<3> to CNT_GRP16<3> in step S1340. Accordingly, the counters C1 to C16 may be initialized in step S1350. In other words, only counters included in the third group may be initialized at each target refresh period.

The input control circuit 131 may provide the shadow address SDW_ADD as the input address ADD_IN. The latch input control circuit 420 may activate one activated signal among the null signals NULL1 to NULL16 as an input control signal according to a predetermined order, and the corresponding latch among the latches LAT1 to LAT16 may store the input address ADD_IN according to the input control signal in step S1360.

According to this embodiment of the present invention, when a target address is selected among addresses stored in a plurality of latches by sampling an active address, a semiconductor memory device may divide counters and latches corresponding thereto into at least two groups based on the counting values which are obtained by counting the number of times that an active address is repeatedly input, select a target address out of the latches belonging to the group of the counters each having a large counting value, and initialize only the counters belonging to the group of the counters each having a small counting value. In this way, the semiconductor memory device may prevent an unnecessary address comparison operation, which improves the refresh efficiency of the semiconductor memory device.

Also, according to one embodiment of the present invention, the semiconductor memory device may maximize the accuracy of the address sampling by sampling active addresses that are not stored in latches during one target refresh period by using a separate shadow latch.

Also, according to one embodiment of the present invention, the area occupied by an address comparison circuit in the semiconductor memory device may be reduced as an address comparison operation is sequentially performed by using a plurality of active signals which are generated by shifting one active command.

While the present invention has been described with respect to the specific embodiments, it will be apparent to those skilled in the art that various changes and modifications may be made without departing from the spirit and scope of the invention as defined in the following claims.

For example, the positions and types of the logic gates and transistors exemplified in the above-described embodiments should be implemented differently according to the polarity of an input signal.

What is claimed is:

1. A semiconductor memory device, comprising:
an input control circuit suitable for providing an active address which is input together with an active command, as an input address;
a plurality of latches suitable for sequentially storing, as a latch address, the input address according to input control signals and outputting the latch addresses as a target address according to output control signals;
a plurality of counters respectively corresponding to the latches and each suitable for increasing, when the active address matches the latch address stored in the latch, a counting value corresponding to the latch; and
a refresh controller suitable for dividing the counters and the latches into a plurality of groups based on the counting values and generating, in response to a refresh command, reset signals for initializing the counters included in one group of the groups.

2. The semiconductor memory device of claim 1,
wherein the refresh controller divides the counters and the latches into the groups by:
classifying, into a first group, the counters each having the counting value equal to or greater than a threshold value and corresponding ones of the latches,
classifying, into a second group, the counters each having the counting value less than the threshold value and corresponding ones of the latches, and
wherein the refresh controller generates the reset signals for initializing the counters included in the second group.

3. The semiconductor memory device of claim 1,
wherein the refresh controller is further suitable for generating, in response to the refresh command, the output control signals to output, as the target address, the latch address from a selected one of the latches included in remaining groups other than the one group of the groups, and
wherein the refresh controller generates the reset signal for initializing the counter corresponding to the selected latch.

4. The semiconductor memory device of claim 3,
wherein when there are no latches included in the remaining groups of the groups, the refresh controller is further suitable for generating, in response to the refresh command, the output control signals to output, as the target address, a latch address stored in a preset latch, and
wherein the refresh controller generates the reset signal for initializing the counter corresponding to the preset latch.

5. The semiconductor memory device of claim 1, wherein when the active address does not match any of the latch addresses stored in the latch, the refresh controller is further suitable for generating the input control signals in such a manner that the input address is stored in a latch corresponding to a counter having the counting value of zero in response to the active command or the refresh command.

6. The semiconductor memory device of claim 1, wherein when the active address does not match any of the latch addresses and the latches are all in a full-state, the input control circuit is further suitable for randomly sampling the active address as a shadow address and providing, in response to the refresh command, the shadow address as the input address.

7. The semiconductor memory device of claim 1, further comprising a control signal generation circuit suitable for generating first to fourth active signals that are sequentially activated in response to the active command.

8. The semiconductor memory device of claim 7, further comprising a plurality of address comparators suitable for generating a plurality of match signals by comparing the active address with the latch addresses.

9. The semiconductor memory device of claim 8, wherein each of the latches is further suitable for:
receiving one signal of the first to fourth active signals, and
providing a corresponding one of the address comparators with the latch address stored therein when the received active signal is activated.

10. The semiconductor memory device of claim 8,
wherein each of the counters is further suitable for receiving one signal of the first to fourth active signals,
wherein each of the counters increases the counting value thereof according to the match signal corresponding thereto when the received active signal is activated, and
wherein each of the counters is initialized according to the reset signal corresponding thereto.

11. The semiconductor memory device of claim 1, wherein the input control circuit includes:
an enable signal generation unit suitable for generating a latch enable signal according to the active command and an oscillating signal when the active address does not match any of the latch addresses and the latches are all in a full state;
a shadow latch unit suitable for storing the active address as a shadow address according to the latch enable signal;
a selection signal generation unit suitable for generating a selection signal that is activated according to the refresh command and deactivated according to the active command; and
an address output unit suitable for selecting one of the active address and the shadow address and outputting the selected address as the input address, according to the selection signal.

12. The semiconductor memory device of claim 1, wherein the refresh controller includes:
a group decoder suitable for generating, based on the counting values, a plurality of group signals and first to third group enable signals, each group signal being formed of first to third bits respectively representing first to third groups;
a latch input control circuit suitable for generating, in response to the active command or the refresh command, the input control signals based on a plurality of match signals and a plurality of null signals, the match signals respectively indicating whether the active address matches the latch addresses stored in the latches and the null signals respectively indicating states of the counters;

a latch output control circuit suitable for generating, based on the refresh command and the first to third group enable signals, the output control signals corresponding to the first and second bits of the group signals; and a reset control circuit suitable for generating, according to the refresh command, the reset signals corresponding to the third bits of the group signals.

13. The semiconductor memory device of claim 12, wherein the group decoder generates the group signals respectively corresponding to the counting values, wherein the group decoder is further suitable for:

setting, when a selected counting value is equal to or greater than a first threshold value, a first bit of the group signal corresponding to the selected counting value to a logic high level, setting, when the selected counting value is equal to or greater than a second threshold value and less than the first threshold value, a second bit of the group signal corresponding to the selected counting value to a logic high level, and setting, when the selected counting value is less than the second threshold value, a third bit of the group signal corresponding to the selected counting value to a logic high level, and wherein the group decoder is further suitable for:

activating the first group enable signal when any one of the first bits is a logic high bit, activating the second group enable signal when all the first bits are logic low bits and any one of the second bits is a logic high bit, and activating the third group enable signal when both of the first group enable signal and the second group enable signal are deactivated.

14. The semiconductor memory device of claim 12, wherein the latch input control circuit includes:

a sequence control circuit suitable for generating a plurality of sequential null signals respectively corresponding to the null signals according to a predetermined order when all the match signals are deactivated; and a signal output circuit suitable for outputting the sequential null signals as the input control signals when the active command or the refresh command is input.

15. The semiconductor memory device of claim 12, wherein the latch output control circuit includes:

a first latch output control unit suitable for generating the output control signals corresponding to the first bits of the group signals according to the refresh command and the first group enable signal;

a second latch output control unit suitable for generating the output control signals corresponding to the second bits of the group signals according to the refresh command and the second group enable signal; and a third latch output control unit suitable for generating a first output control signal of the output control signals according to the refresh command and the third group enable signal.

16. A semiconductor memory device, comprising:

a plurality of latches suitable for storing input addresses as latch addresses according to input control signals and outputting the latch addresses as target addresses according to output control signals;

a plurality of address comparators suitable for comparing an active address with the latch addresses to generate a plurality of match signals;

a plurality of counters suitable for respectively generating a plurality of counting signals according to the match signals and being initialized respectively according to a plurality of reset signals;

a group decoder suitable for generating, based on the counting signals, a plurality of group signals and first to third group enable signals, each group signal being formed of first to third bits respectively representing first to third groups;

a latch input control circuit suitable for generating the input control signals according to the match signals and null signals respectively indicating states of the counters;

a latch output control circuit suitable for generating, according to a refresh command and the first to third group enable signals, the output control signals corresponding to the first and second bits of the group signals; and a reset control circuit suitable for generating, according to the refresh command, the reset signals corresponding to the third bit of the group signals.

17. The semiconductor memory device of claim 16, further comprising an input control circuit suitable for:

providing the active address as an input address, and randomly sampling the active address as a shadow address according to the match signals and the null signals when an active command is input, and providing the shadow address as the input address when the refresh command is input.

18. The semiconductor memory device of claim 17, wherein the input control circuit includes:

an enable signal generation unit suitable for generating a latch enable signal according to an active command and an oscillating signal when the match signals and the null signals are all deactivated;

a shadow latch unit suitable for storing the active address as a shadow address according to the latch enable signal;

a selection signal generation unit suitable for generating a selection signal that is activated according to the refresh command and deactivated according to the active command; and an address output unit suitable for selecting one of the active address and the shadow address and outputting the selected address as the input address, according to the selection signal.

19. The semiconductor memory device of claim 17, wherein the group decoder generates the group signals respectively corresponding to the counting signals, wherein the group decoder is further suitable for:

setting, when a selected counting value is equal to or greater than a first threshold value, the first bit of the group signal corresponding to the selected counting value to a logic high level, setting, when the selected counting value is equal to or greater than a second threshold value and less than the first threshold value, the second bit of the group signal corresponding to the selected counting value to a logic high level, and setting, when the selected counting value is less than the second threshold value, the third bit of the group signal corresponding to the selected counting value to a logic high level, and wherein the group decoder is further suitable for:

activating the first group enable signal when any one of the first bits is a logic high bit, activating the second group enable signal when all the first bits are logic low bits, and any one of the second bits is a logic high bit, and activating the third group enable signal when both of the first group enable signal and the second group enable signal are deactivated.

20. The semiconductor memory device of claim 16, wherein the latch input control circuit includes:

a sequence control circuit suitable for generating a plurality of sequential null signals respectively corresponding to the null signals according to a predetermined order when all the match signals are deactivated; and a signal output circuit suitable for outputting the sequential null signals as the input control signals when an active command or the refresh command is input.

21. The semiconductor memory device of claim 16, wherein the latch output control circuit includes:

a first latch output control unit suitable for generating the output control signals corresponding to the first bits of the group signals according to the refresh command and the first group enable signal;

a second latch output control unit suitable for generating the output control signals corresponding to the second bits of the group signals according to the refresh command and the second group enable signal; and a third latch output control unit suitable for generating a first output control signal of the output control signals according to the refresh command and the first group enable signal.

22. A method for operating a semiconductor memory device, comprising:

generating, by a plurality of counters, respective counting signals by counting respective match signals generated through comparison between an active address and latch addresses stored in respective latches when an active command is input;

dividing the counters and the latches into a first group and a second group based on the counting signals; and outputting, as a target address, one of the latch addresses of the latches included in the first group and initializing the counters included in the second group, when a refresh command is input.

23. The method of claim 22, wherein the dividing includes:

classifying, into the first group, the counters each having the counting value equal to or greater than a threshold value and corresponding ones of the latches, and classifying, into a second group, the counters each having the counting value less than the threshold and corresponding ones of the latches.

24. The method of claim 22, further comprising outputting, when there are no latches included in the first group, a latch address stored in a preset latch as the target address.

25. The method of claim 22, further comprising:

storing the active address in one latch of the latches or randomly sampling the active address as a shadow address when the active command is input; and storing, when the refresh command is input, the shadow address in one of the latches, wherein the active address is randomly sampled when all the match signals are deactivated and all the latches are in a full-state.

26. A semiconductor memory device comprising:

a row control circuit configured to perform a target refresh operation on a memory cell array according to a target refresh command and a target address; and a refresh control circuit configured to:

latch an active address when the active address is not the same as any of latched addresses;

increase, when the active address is the same as a specific one of the latched addresses, a count corresponding to the specific addresses;

provide, in response to the target refresh command, the row control circuit with any of the one or more latched addresses each corresponding to the count greater than a threshold as the target address while initializing the count corresponding to the provided address;

provide, in response to the target refresh command, the row control circuit a with any of the one or more latched address each corresponding to the count less than the threshold as the target address when there is not any of the latched addresses corresponding to the count greater than the threshold; and initialize the count less than the threshold.

27. The semiconductor memory device of claim 26, wherein the refresh control circuit latches the active address as a shadow address when the refresh control circuit is full of the latched addresses, and wherein the refresh control circuit is further configured to latch the shadow address after the providing.

* * * * *